United States Patent
Wang et al.

(10) Patent No.: US 11,761,063 B2
(45) Date of Patent: Sep. 19, 2023

(54) METHOD FOR PREPARING HIGH-ENTROPY ALLOY COMPOSITES REINFORCED BY DIAMOND PARTICLES

(71) Applicant: TAIYUAN UNIVERSITY OF TECHNOLOGY, Taiyuan (CN)

(72) Inventors: Yongsheng Wang, Taiyuan (CN); Shengwang Yu, Taiyuan (CN); Changxing Han, Taiyuan (CN); Naixu Wang, Taiyuan (CN); Bing Zhou, Taiyuan (CN); Yong Ma, Taiyuan (CN); Jie Gao, Taiyuan (CN); Hongjun Hei, Taiyuan (CN); Yanxia Wu, Taiyuan (CN)

(73) Assignee: TAIYUAN UNIVERSITY OF TECHNOLOGY, Taiyuan (CN)

( * ) Notice: Subject to any disclaimer, the term of this patent is extended or adjusted under 35 U.S.C. 154(b) by 0 days.

(21) Appl. No.: 18/097,757

(22) Filed: Jan. 17, 2023

(65) Prior Publication Data

US 2023/0257856 A1   Aug. 17, 2023

(30) Foreign Application Priority Data

Feb. 12, 2022   (CN) .......................... 202210130762.8

(51) Int. Cl.
  *C23C 14/35*   (2006.01)
  *C22C 26/00*   (2006.01)
(52) U.S. Cl.
  CPC .............. *C22C 26/00* (2013.01); *C23C 14/35* (2013.01)

(58) Field of Classification Search
  CPC ................................. C23C 14/35; C22C 26/00
  USPC ........................................ 204/192.12, 192.15
  See application file for complete search history.

(56) References Cited

U.S. PATENT DOCUMENTS 3,924,031 A   12/1975   Nicholas

FOREIGN PATENT DOCUMENTS

| CN | 108060322 A | 5/2018 |
|----|-------------|--------|
| CN | 108842106 A | 11/2018 |
| CN | 108950299 A | 12/2018 |
| CN | 109182866 A | 1/2019 |
| CN | 110964938 A | 4/2020 |
| CN | 111455346 A | 7/2020 |
| CN | 113293331 A | 8/2021 |

*Primary Examiner* — Rodney G McDonald
(74) *Attorney, Agent, or Firm* — Stuart H. Mayer; Kaplan Breyer Schwarz, LLP

(57) ABSTRACT

Disclosed is a method for preparing a high-entropy alloy composites reinforced by diamond particles, belonging to the technical field of metal composites preparation. A vacuum coating preparation equipment equipped with an in-situ heating sample stage is used to perform a treatment of high-entropy alloy metallizing coating on the surface of diamond particles to generate modified diamond particles, where the alloy of the coating includes any four, five or six elements among seven elements of Ti, Zr, Hf, Nb, Ta, W and Mo in an equal atomic proportion. The obtained coating generates carbide film in-situ with the surface layer of diamond particles, while the high-entropy alloy covers the carbide film, ensuring a strong bond with the diamond, and the high-entropy alloy composites reinforced by diamond particles are finally prepared.

4 Claims, 4 Drawing Sheets

METHOD FOR PREPARING HIGH-ENTROPY ALLOY COMPOSITES REINFORCED BY DIAMOND PARTICLES

CROSS-REFERENCE TO RELATED APPLICATIONS

This application claims priority to Chinese Patent Application No. 202210130762.8, filed on Feb. 12, 2022, the contents of which are hereby incorporated by reference.

TECHNICAL FIELD

The present application belongs to the technical field of metal matrix composites, and particularly relates to a method for preparing a high-entropy alloy composites reinforced by diamond particles.

BACKGROUND

The diamond is by far the hardest material found in the world and is widely used in various cutting and grinding tools such as abrasives, cutters for its excellent properties of stiffness, wear resistance, thermal conductivity and thermal stability. It is common in industry to use diamond particles as a reinforcing phase to improve the mechanical properties and thermal conductivity of materials, e.g. aluminum matrix composites reinforced by diamond particles. However, the diamond and conventional metals have extremely poor wettability and large differences in thermal expansion coefficients, thus making these composite usually subject to interfacial problems, and resulting in degradation of their properties. Therefore, it is important to optimize the interfacial bonding properties between diamond and matrix so as to improve the macroscopic properties of such composites. A surface modification method, as a common method, involves coating or cladding a modified layer on the surface of diamond particles to improve the interfacial bonding properties between the diamond particles and the metal matrix. To date, there are various methods for surface modification of diamond particles, including chemical plating, electroplating, vacuum micro-vapor depositing, chemical vapor depositing, magnetron sputtering, etc. For example, patent (CN 110438457 A), literature (Chinese Journal of Nonferrous Metals DOI: 10.11817/j.ysxb.1004.0609.2021-42057), etc. reported preparing Mo, W, Cr, Ti, Zr coatings on diamond surface by magnetron sputtering, multi-arc ion plating and other processes, which are then applied to prepare copper matrix composites with high thermal conductivity. Nevertheless, such methods usually require post-treatment of heating to improve the bonding between the coating and diamond, or else the interfacial bonding properties of the coating and diamond particles cannot be secured.

High-entropy alloys (alloys prepared by mixing 5 or more metal elements in equal atomic ratios), owing to their unique composition and crystal structure, possess excellent properties incomparable to traditional metallic materials, including high strength, high hardness, and high wear resistance. Consequentially, such materials are regarded as having important application prospects in the engineering field and have therefore become popular materials desired by researchers worldwide. In addition, elements (titanium (Ti), zirconium (Zr), hafnium (Hf), niobium (Nb), tantalum (Ta), vanadium (V), bismuth (Mo), etc.) with strong affinity to carbon are often employed to prepare carbide ceramics. Carbides (such as TiC, HfC, TaC, etc.) are characterized by high melting point, high hardness, good wear resistance, and corrosion resistance. However, no report thus far refers to the preparation of high-entropy alloy composites containing diamond particles by combining the advantages of diamond and high-entropy alloys.

SUMMARY

In order to overcome the problem of interfacial bonding between diamond and metal matrix, the present application is designed to provide a method for preparing a high-entropy alloy composites reinforced by diamond particles, which has high strength, high hardness, high wear resistance and high thermal conductivity.

To achieve the above objectives, the present application adopts the following technical scheme: a method for preparing high-entropy alloy composites reinforced by diamond particles, including:

step 1, cleaning diamond particles by boiling with diluted alkali solution and acid solution to remove oil, followed by washing with deionized water for 3-5 times to clean surfaces of the diamond particles to neutral, and then taking out and drying, where the alkali solution is 5 weight percentage (wt. %) NaOH, and the acid solution is 30 wt. % $HNO_3$ solution;

step 2, heating the diamond particles with a particle size of 30-300 microns (μm) to 400-900 degree Celsius (° C.) with using vacuum coating preparation equipment, and performing a high-entropy alloy metallizing coating treatment on the surfaces of the diamond particles to obtain high-entropy alloy coatings on the surfaces of the diamond particles, that is modified diamond particles, where the vacuum coating preparation equipment includes in-situ heating sample stage with magnetron sputtering, and plasma surface metallurgy equipment;

the high-entropy alloy includes any four metals of titanium (Ti), zirconium (Zr), hafnium (Hf), niobium (Nb), tantalum (Ta), tungsten (W), and bismuth (Mo) in equal atomic proportions, any five metals in equal atomic proportions or any six metals in equal atomic proportions;

the above metals are carbophilic in nature and react with diamond particles under high temperature to develop a carbide film in situ on a surface layer of the coating in contact with the diamond particles, and the high-entropy alloy covers the carbide film so as to ensure a strong bond with the diamond;

step 3, adding the modified diamond particles as reinforcing phase into a high-entropy alloy matrix by an arc melting method, where the elements of the coating are required to be of a same type as those of the alloy matrix; putting the metals weighed and the modified diamond particles together into a vacuum non-self-consuming arc melting furnace, evacuating to below $1.5 \times 10^{-3}$ pascal (Pa), charging argon to 0.5 standard atmosphere (atm), and then melting 6-8 times to obtain high-entropy alloy composites reinforced by diamond particles.

In the high-entropy alloy metallizing coating treatment on the surface of diamond particles, the diamond particles are placed on a specimen tray and mechanically or electromagnetically vibrated for 30 seconds (s) to 1 minute (min) every 10 min-30 min.

As comparing to the prior art, the present application prepares the high-entropy alloy coating on the diamond surface firstly by using the magnetron sputtering with heating stage, or by plasma surface metallurgy technology equipment (as shown in FIGS. 1-2) using the high-entropy alloy fused with carbophilic elements as the target material. Owing to the strong affinity of the target elements of the high-entropy alloy with carbon, the high-entropy alloy coating reacts with the diamond to produce metal carbides firstly, and then the metal carbides prevents the diamond from reacting with the high-entropy alloy coating during the preparation of the coating, thus forming a structure in which the diamond particle surface is covered with the high-entropy carbide layer and the carbide layer is covered with the high-entropy alloy coating (see FIG. 3).

Diamond particles covered with high-entropy alloy coating are added to the high-entropy alloy matrix (FIG. 4) to obtain high-entropy alloy composites reinforced by diamond particles.

According to the present application, the bonding strength of matrix alloys and reinforcing phase is improved, and the obtained metals not only have the characteristics of high strength and high hardness of high-entropy alloy material, but also features high wear resistance and high thermal conductivity of diamond.

The high-entropy alloy coating obtained by the present application has good wettability and high binding strength with diamond particles; and by adding the modified diamond particles as the reinforcing phase into the high-entropy alloy matrix, the high-entropy alloy composites are effectively improved in properties such as strength, hardness ($HV_{0.3}$ (Vickers-hardness) of 360-700), wear resistance, thermal conductivity, etc.

DETAILED DESCRIPTION OF THE EMBODIMENTS

For a better understanding of the embodiments of the present application by those in the art, the technical schemes in the embodiments of the present application are described clearly and completely below in conjunction with the accompanying drawings in the embodiments of the present application. It is clear that the embodiments described are only some of the embodiments of the present application, and not all of them. Based on the embodiments in the present application, all other embodiments obtained by a person of ordinary skill in the art without making creative labor shall fall within the scope of protection of the present application.

As shown in FIGS. 1-4, the present application adopts magnetron sputtering method to coat the surface of diamond particles with metal, so as to effectively improve the wettability and interfacial bonding between the metal matrix and diamond particles, and thus the performance of metal-based composites reinforced by diamond particles can be significantly improved.

Figure 1:
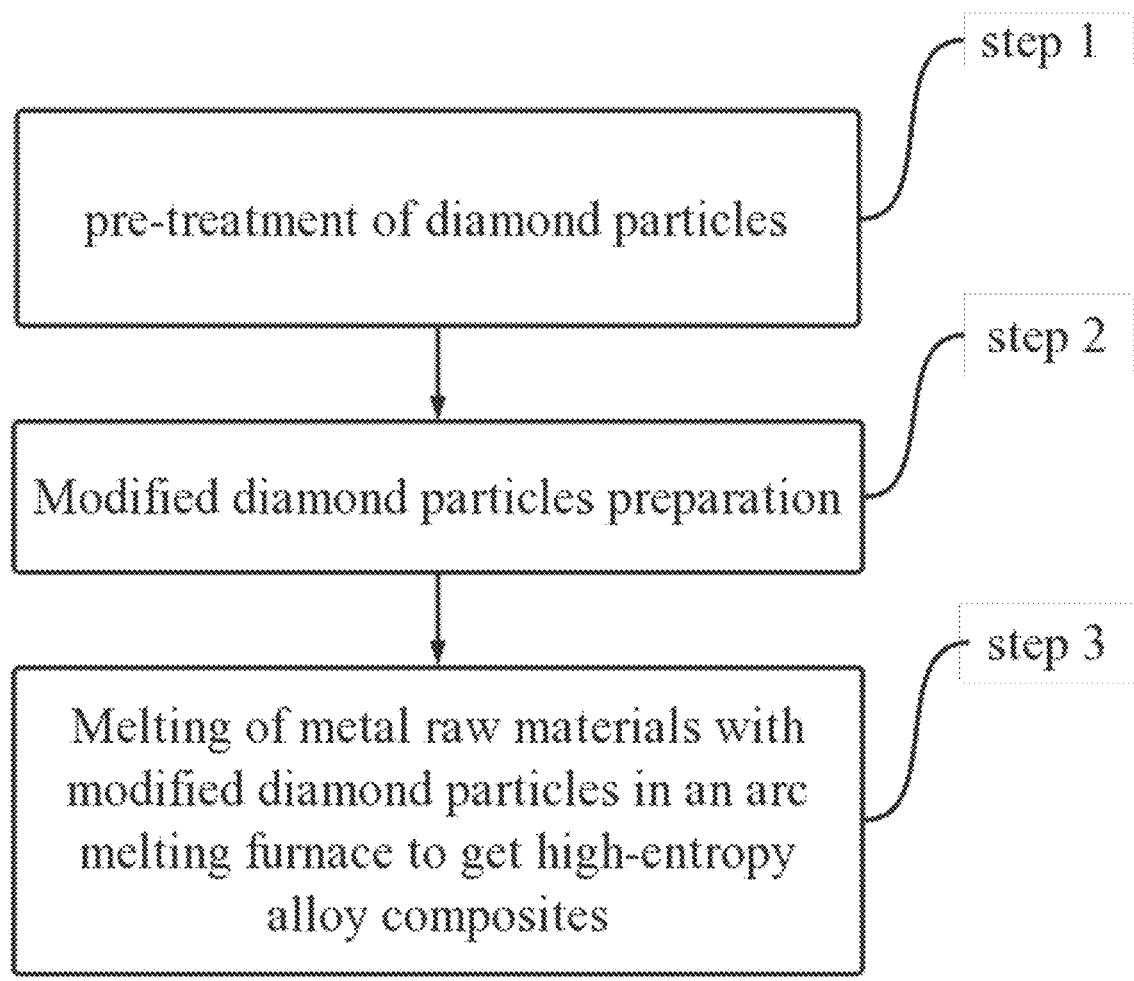
FIG. 1 shows a processing of preparing high-entropy alloy composites reinforced by diamond particles.
Figure 2:
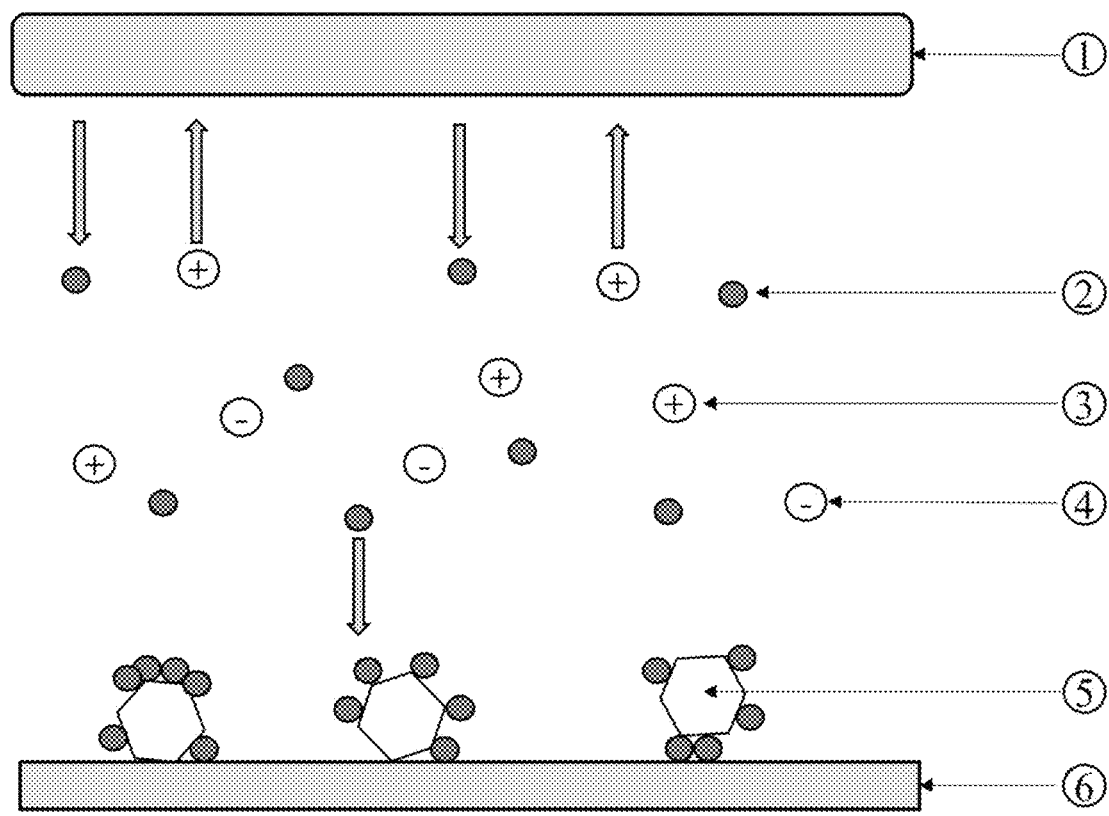
FIG. 2 is schematic diagram of coating modified diamond particles by magnetron sputtering on a high-entropy alloy target.
Figure 3:
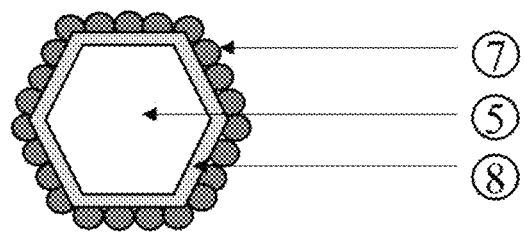
FIG. 3 is a structural diagram of modified diamond particles.
Figure 4:
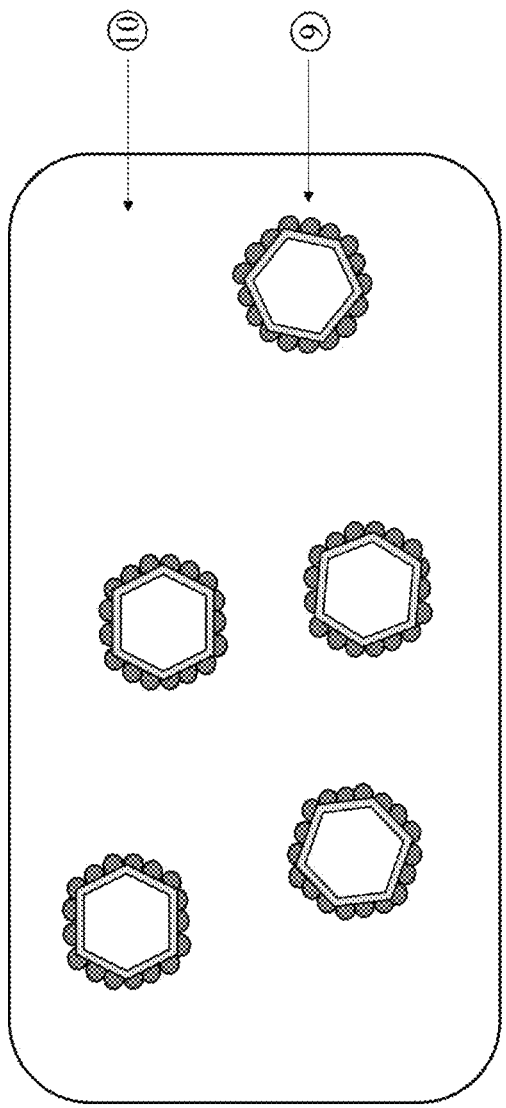
FIG. 4 shows a high-entropy alloy composites reinforced by modified diamond particles.

Embodiment 1 step 1, pre-treatment of diamond particles: 30 grams (g) diamond particles with a particle size of 50 microns (μm) is weighed using an electronic balance, the diamond particles are cleaned by boiling with 10 weight percentage (wt. %) NaOH and 30 wt. % $HNO_3$ solution in turn for 10 minutes (min) to remove oil, washed with deionized water for 2-3 times for surface purification, and cleaned to neutrality;

step 2, coating preparation: magnetron sputtering coating equipment is utilized, 30 g of diamond particles cleaned in step 1 is put on a sample stage of the equipment, and the sample stage is heated to 450 degree Celsius (° C.) in a vacuum room under a working atmosphere of Ar, sputtering power of 150 watts (W), target current of 0.5 ampere (A), working pressure of 0.4 pascal (Pa) and sputtering duration of 60 min with high-entropy alloy target of TiZrHfTaMo (titanium (Ti), zirconium (Zr), hafnium (Hf), tantalum (Ta), and bismuth (Mo)); the diamond is vibrated in a tray by ultrasonic vibration device for 30 s every 15 min to make the diamond surface uniformly covered with high-entropy alloy coating by diamond tumbling, then the modified diamond particles is obtained; the preparation is illustrated as shown in FIG. 2, where: hydrogen plasma ③ bombards the high-entropy alloy target ① to produce high-entropy alloy particles ②, which are deposited on surface of diamond particles ⑤ under electromagnetic field, and ultrasonic vibration device ⑥ vibrates to cover the surface of diamond particles with high-entropy alloy layer ⑦, then the modified diamond particles ⑨ are obtained (as shown in FIG. 3);

step 3, weighing and composites melting: weighing, high-entropy alloys are prepared according to the proportion of selected target materials, including: high-entropy alloy of TiZrHfTaMo is selected with an equal atomic ratio to prepare 30 g of metal raw materials, in which the purity of each metal element is ≥99.9%, and the prepared metal raw materials are put into 4% HCl solution to be cleaned and degreased, and subjected to cleaning with deionized water of 2-3 times for surface purification, and cleaning to neutrality; then, 1 g of the modified diamond particles with a weight of 1 g are added into the 30 g of metal raw materials, where the percentage of the second phase of the composites is 3.2%; similarly, the modified diamond particles with a weight of 5 g are added into 30 g of metal raw materials, and the corresponding percentage of the second phase of the composites is 14.3%; according to this method, the percentage of the second phase of the composites is calculated;

composites melting, the 30 g of metal raw material proportioned in the previous step and the weighed modified diamond particles are put into a vacuum non-self-consuming arc melting furnace, evacuated to below $1.5 \times 10^{-3}$ Pa, filled with argon to 0.5 atmosphere (atm), and melted to form composites of diamond particles and high-entropy alloys. After the alloy cooled, the alloy in a copper mold crucible is turned over and melted again, and repeated 6-8 times. During the melting, the metal elements react with diamond to produce a high entropy alloy carbide layer ⑧, the elements of the high-entropy alloy coating are the same or similar to those of the high-entropy alloy matrix ⑩. When the modified diamond particles are added to the high-entropy alloy, the high-entropy alloy composites reinforced by diamond particles is obtained (as shown in FIG. 4).

Embodiment 2 step 1, pre-treatment of diamond particles: the diamond particles used in this embodiment are of 100 μm and are subjected to the pre-treatment method same as in Embodiment 1.

step 2, coating preparation: magnetron sputtering coating equipment is utilized, 30 g of diamond particles cleaned in step 1 is put on a sample stage of the equipment; then, the sample stage is heated to 480° C. in a vacuum room under a working atmosphere of Ar, sputtering power of 180 W, target current of 0.5 A, working pressure of 0.6 Pa and sputtering duration of 90 min with high-entropy alloy target of WZrHfTa (tungsten (W)); the diamond is vibrated in a tray by ultrasonic vibration device for 30 s every 20 min to make the diamond surface uniformly covered with high-entropy alloy coating by diamond tumbling (see FIG. 3);

step 3, weighing and composites melting: weighing, the same as in Embodiment 1; and composites melting, same as in Embodiment 1.

Embodiment 3 step 1, pre-treatment of diamond particles: 150 μm of diamond particles are selected, and the pre-treatment method is the same as that of Embodiment 1;

step 2, coating preparation: magnetron sputtering coating equipment is utilized, 30 g of diamond particles cleaned in step 1 is put on a sample stage of the equipment; then the sample stage is heated to 400° C. in a vacuum room under a working atmosphere of Ar, sputtering power of 50 W, target current of 0.5 A, working pressure of 3 Pa and sputtering duration of 100 min with high-entropy alloy target of NbZrTiTaMo (niobium (Nb)); the diamond is vibrated in a tray by ultrasonic vibration device for 30 s every 10 min to make the diamond surface uniformly covered with high-entropy alloy coating by diamond tumbling (see FIG. 3);

step 3, weighing and composites melting: weighing, the same as in Embodiment 1; and composites melting, same as in Embodiment 1.

Embodiment 4 step 1, pre-treatment of diamond particles: the selected diamond particles are of 50 μm, and the pre-treatment method is the same as in Embodiment 1;

step 2, coating preparation: magnetron sputtering coating equipment is utilized, 30 g of diamond particles cleaned in step 1 is put on a sample stage of the equipment; then the sample stage is heated to 400° C. in a vacuum room under a working atmosphere of Ar, sputtering power of 200 W, target current of 0.5 A, working pressure of 5 Pa and sputtering duration of 45 min with high-entropy alloy target of WNbHfTiTa; the diamond is vibrated in a tray by ultrasonic vibration device for 30 s every 15 min to make the diamond surface uniformly covered with high-entropy alloy coating by diamond tumbling (as shown in FIG. 3);

step 3, weighing and composites melting: weighing, the same as in Embodiment 1; and composites melting, same as in Embodiment 1.

Embodiment 5 step 1, pre-treatment of diamond particles: the diamond particles are of 200 microns, and the pre-treatment method is the same as in Embodiment 1;

step 2, coating preparation: magnetron sputtering coating equipment is utilized, 30 g of diamond particles cleaned in step 1 is put on a sample stage of the equipment; then, the sample stage is heated to 420° C. in a vacuum room under a working atmosphere of Ar, sputtering power of 200 W, target current of 0.5 A, working pressure of 10 Pa and sputtering duration of 100 min with high-entropy alloy target of HfNbWTiMoZr; the diamond is vibrated in a tray by ultrasonic vibration device for 30 s every 20 min to make the diamond surface uniformly covered with high-entropy alloy coating by diamond tumbling (as shown in FIG. 3);

step 3, weighing and composites melting: weighing, the same as in Embodiment 1; and composites melting, same as in Embodiment 1.

Embodiment 6 step 1, pre-treatment of diamond particles: diamond particles of 280 microns are selected, and the pre-treatment method is the same as that of Embodiment 1;

step 2, coating preparation: magnetron sputtering coating equipment is utilized, 30 g of diamond particles cleaned in step 1 is put on a sample stage of the equipment; then, the sample stage is heated to 500° C. in a vacuum room under a working atmosphere of Ar, sputtering power of 250 W, target current of 0.5 A, working pressure of 0.3 Pa and sputtering duration of 180 min with high-entropy alloy target of ZrHfTaNbMoTi; the diamond is vibrated in a tray by ultrasonic vibration device for 30 s every 20 min to make the diamond surface uniformly covered with high-entropy alloy coating by diamond tumbling (as shown in FIG. 3);

step 3, weighing and composites melting: weighing, the same as in Embodiment 1; and composites melting, same as in Embodiment 1.

Embodiment 7 step 1, pre-treatment of diamond particles: the diamond particles are of 100 microns, and the pre-treatment method is the same as in Embodiment 1;

step 2, coating preparation: magnetron sputtering coating equipment is utilized, 30 g of diamond particles cleaned in step 1 is put on a sample stage of the equipment; then, the sample stage is heated to 450° C. in a vacuum room under a working atmosphere of Ar, sputtering power of 160 W, target current of 0.5 A, working pressure of 10 Pa and sputtering duration of 100 min with high-entropy alloy target of WZrTaMo; the diamond is vibrated in a tray by ultrasonic vibration device for 30 s every 15 min to make the diamond surface uniformly covered with high-entropy alloy coating by diamond tumbling (as shown in FIG. 3);

step 3, weighing and composites melting: weighing, the same as in Embodiment 1; and composites melting, same as in Embodiment 1.

Embodiment 8 step 1, pre-treatment of diamond particles: the diamond particles are of 80 microns, and the pre-treatment method is the same as that of Embodiment 1;

step 2, coating preparation: magnetron sputtering coating equipment is utilized, 30 g of diamond particles cleaned in step 1 is put on a sample stage of the equipment; then, the sample stage is heated to 480° C. in a vacuum room under a working atmosphere of Ar, sputtering power of 100 W, target current of 0.5 A, working pressure of 0.5 Pa and sputtering duration of 180 min with high-entropy alloy target of WZrTiTaMo; the diamond is vibrated in a tray by ultrasonic vibration device for 30 s every 15 min to make the diamond surface uniformly covered with high-entropy alloy coating by diamond tumbling (as shown in FIG. 3);

step 3, weighing and composites melting: weighing, the same as in Embodiment 1; and composites melting, same as in Embodiment 1.

What is claimed is:

1. A method for preparing a high-entropy alloy composites reinforced by diamond particles, comprising:

step 1, cleaning the diamond particles by boiling with diluted alkali solution and acid solution to remove oil, then washing with deionized water for 3-5 times to clean surfaces of the diamond particles to neutral, taking out and drying;

step 2, placing the diamond particles on a sample stage using a vacuum coating preparation equipment equipped with an in-situ heating sample stage, and performing high-entropy alloy metallizing coating on the surfaces of the diamond particles to obtain modified diamond particles, wherein the high-entropy alloy metallizing comprises elements of any four, five, or six of metal elements Ti, Zr, Hf, Nb, Ta, W, and Mo in an equal atomic ratio; and step 3, adding the modified diamond particles obtained in the step 2 as a reinforcing phase into a high-entropy alloy matrix with same element types as the high-entropy alloy metallizing coating, then melting in a vacuum non-self-consuming arc melting furnace, evacuating the furnace to below $1.5 \times 10^{-3}$ pascal (Pa) and charging with argon to 0.5 atmosphere (atm), and dispersing the diamond particles uniformly and melting 6-8 times by electromagnetic stirring, then pouring and cooling to prepare the high-entropy alloy composites reinforced by diamond particles.

2. The method for preparing a high-entropy alloy composites reinforced by diamond particles according to claim 1, wherein the alkali solution is 5 weight percentage (wt. %) NaOH, and the acid solution is 30 wt. % $HNO_3$ solution.

3. The method for preparing a high-entropy alloy composites reinforced by diamond particles according to claim 1, wherein the diamond particles placed on the sample stage are heated to 400-900 degree Celsius (° C.) as applying the high-entropy alloy metallizing coating to the surfaces of the diamond particles.

4. The method for preparing a high-entropy alloy composites reinforced by diamond particles according to claim 1, wherein the diamond particles placed on the sample stage are mechanically or electromagnetically vibrated for 30 seconds (s) to 1 minute (min) every 10 min-30 min.

* * * * *